US012362837B2

(12) United States Patent
Yamamoto et al.

(10) Patent No.: US 12,362,837 B2
(45) Date of Patent: Jul. 15, 2025

(54) OPTICAL SIGNAL DEMODULATOR, CONTROL METHOD AND PROGRAM

(71) Applicant: NIPPON TELEGRAPH AND TELEPHONE CORPORATION, Tokyo (JP)

(72) Inventors: Shuto Yamamoto, Musashino (JP); Masanori Nakamura, Musashino (JP); Hiroki Taniguchi, Musashino (JP); Yoshiaki Kisaka, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 218 days.

(21) Appl. No.: 18/017,890

(22) PCT Filed: Aug. 3, 2020

(86) PCT No.: PCT/JP2020/029660
§ 371 (c)(1),
(2) Date: Jan. 25, 2023

(87) PCT Pub. No.: WO2022/029835
PCT Pub. Date: Feb. 10, 2022

(65) Prior Publication Data
US 2023/0261759 A1    Aug. 17, 2023

(51) Int. Cl.
*H04B 10/00*    (2013.01)
*H04B 10/69*    (2013.01)

(52) U.S. Cl.
CPC ................... *H04B 10/69* (2013.01)

(58) Field of Classification Search
CPC ...... H04B 10/69; H04B 10/616; H03M 13/23
See application file for complete search history.

(56) References Cited

U.S. PATENT DOCUMENTS 9,473,250 B2 * 10/2016 Koike-Akino ........ H04L 1/0055
11,444,694 B2 * 9/2022 Yamamoto ........... H04B 10/516
(Continued)

FOREIGN PATENT DOCUMENTS

| JP | 2017-520974 A | 7/2017 |
| JP | 2020-077934 A | 5/2020 |
| WO | WO-2016035895 A1 | 3/2016 |

OTHER PUBLICATIONS

"Achievement of186-Gb/s PAM-4 under 20.5-GHz bandwidth limitation using MLSE based on 2nd order Volterra filter" Hiroki Taniguchi, et al. (Year: 2018).*
(Continued)

*Primary Examiner* — Agustin Bello
(74) *Attorney, Agent, or Firm* — Harness, Dickey & Pierce, P.L.C.

(57) ABSTRACT

According to an aspect of the present invention, there is provided an optical signal demodulator including an optical reception unit, an AD conversion unit, a digital signal processing unit, and a signal determination unit, in which the signal determination unit includes: a spectrum shaping filter processing unit that receives a reception signal sequence of the digital signal from the digital signal processing unit and outputs a value obtained by performing a convolution operation on the reception signal sequence which is received; a transmission line simulation filter processing unit that outputs a value obtained by performing a convolution operation on a candidate signal sequence which is determined based on a symbol transition of the reception signal; an error information acquisition unit that acquires error information between the value output from the spectrum shaping filter processing unit and the value output from the transmission line simulation filter processing unit; and a bit determination unit that determines a value of a bit included in the symbol (Continued)

transmitted by a transmission unit based on the error information acquired by the error information acquisition unit.

6 Claims, 9 Drawing Sheets

(56) References Cited

U.S. PATENT DOCUMENTS

| | | | | |
|---|---|---|---|---|
| 11,770,137 | B1* | 9/2023 | Torbatian | H03M 13/2963 |
| | | | | 714/755 |
| 2003/0126545 | A1* | 7/2003 | Tan | H04L 1/006 |
| | | | | 375/E1.002 |
| 2021/0367671 | A1* | 11/2021 | Yamamoto | H04B 10/524 |
| 2023/0085546 | A1* | 3/2023 | Osman | H04L 1/0067 |
| | | | | 398/208 |
| 2023/0261759 | A1* | 8/2023 | Yamamoto | H04B 10/69 |
| | | | | 398/202 |

OTHER PUBLICATIONS

S. Yamamoto et. al., 'O-band 10-km Transmission of 93-Gbaud PAM4 Signal Using Spectral Shaping Technique Based on Nonlinear Differential Coding with 1-Tap Precoding,' Proceeding of OFC2020, T3I.3 (2020).

Hiroki Taniguchi et al., '84-GBaud/λ PAM-4 Transmission over 20-km using 4-λ LAN-WDM TOSA and ROSA with MLSE Based on Nonlinear Channel Estimation', 2020 Optical Fiber Communications Conference and Exhibition (OFC), May 13, 2020.

* cited by examiner

OPTICAL SIGNAL DEMODULATOR, CONTROL METHOD AND PROGRAM

CROSS-REFERENCE TO RELATED APPLICATIONS

This application is a 371 U.S. National Phase of International Application No. PCT/JP2020/029660, filed on Aug. 3, 2020. The entire disclosure of the above application is incorporated herein by reference.

TECHNICAL FIELD

The present invention relates to a technique for an optical signal demodulator, a control method, and a program.

BACKGROUND ART

With an increase in demand for data communication, an optical transmission network using an optical signal modulation technique or an optical signal multiplexing technique that enables large-capacity traffic transmission is becoming widespread. In particular, in an ultra-high speed optical transmission system in which a transmission rate per wave is 100 Gb/s or more, a digital coherent technique in which coherent detection and a digital signal processing technique are combined has been widely used.

On the other hand, with spread of large-capacity data communication represented by long term evolution (LTE) using mobile terminals, it is required to realize ultra-high-speed optical transmission of 100 Gb/s class at a lower cost, that is, with a simpler transceiver configuration.

As a method for realizing ultra-high speed optical transmission of 100 Gb/s class with a simple configuration, a direct detection method for demodulating a data signal based on intensity information of an optical signal has attracted attention. In particular, an ultra-high-speed optical transmission method using a 4-level pulse amplitude modulation method (PAM4) having higher frequency utilization efficiency than in a non return-to-zero (NRZ) method using a 2-level intensity modulation signal has been studied.

In 100 Gb/s class optical transmission using a digital coherent technique that has been put into practical use as a long-distance transmission technique, a polarization-division multiplexing QPSK modulation method (PDM-QPSK) is generally used, and a modulation speed is approximately 25 Gbaud. On the other hand, in a case where ultra-high speed optical transmission of 100 Gb/s class is implemented in a form of using PAM4 that can be realized by a simple transceiver configuration, a modulation rate is approximately 50 Gbaud. In this case, a signal spectrum is a signal spectrum including a wider frequency band than in PDM-QPSK. This means that the PAM4 method of 100 Gb/s class is greatly affected by waveform degradation due to filtering caused by a frequency band of an electro-optical device as compared with the PDM-QPSK method.

In addition, in the direct detection method, waveform degradation due to wavelength dispersion of a transmission fiber cannot be compensated by digital signal processing. As a result, in a case where the PAM4 method is applied, signal quality degradation due to wavelength dispersion also becomes a major problem. The signal quality degradation due to wavelength dispersion is proportional to a square of a modulation rate. Particularly, in a case of a signal modulated at a high speed of 50 Gbaud or more, the signal quality degradation due to wavelength dispersion becomes remarkable.

For this problem, a technique of narrowing the frequency band of the signal spectrum by performing encoding on a transmission side and improving tolerance against waveform degradation due to band limitation of an electro-optical device and waveform degradation due to wavelength dispersion has been proposed (refer to, for example, Non Patent Literature 1). An encoded symbol in this method is generated based on the following Equations.

$$v_n = \tilde{u}_n + \lfloor \alpha v_{n-1} \rfloor \quad \text{[Equation 1]}$$

$$\tilde{u}_n = \mathrm{mod}(u_n - \lfloor \alpha v_{n-1} \rfloor, m) \quad \text{[Equation 2]}$$

In Equation (1) and the like, although "~" is notated above "u", "~" is hereinafter notated as "~u". Further, in Equation (1) and the like, a notation $\lfloor \cdot \rfloor$ is a Gaussian notation, and "n" is a parameter representing a timing.

In Equation (1) and Equation (2), $u_n$ is an original m-value signal before encoding in a time slot n, and is an m-value symbol of $u_n \in \{0, 1, 2, \ldots, m-1\}$. $v_n$ is an encoded symbol. Here, it is assumed that two gray-coded bits are assigned to each symbol. That is, it is assumed that encoding is applied such that the Hamming distance between adjacent symbols is 1.

For example, in a case of m=4, gray-coded bits 00 are assigned to a symbol 0, gray-coded bits 01 are assigned to a symbol 1, gray-coded bits 11 are assigned to a symbol 2, and gray-coded bits 10 are assigned to a symbol 3. An encoded symbol is denoted by $v_n$. $\alpha$ is any real number satisfying $0<\alpha<1$. As is clear from Equation (2), $\sim u_n$ is an m-value symbol, and $\sim u_n \in \{0, 1, 2, \ldots, m-1\}$. An operation for obtaining a signal before encoding, that is, a decoding operation is expressed by the following Equation (3).

$$u_n = \mathrm{mod}(v_n, m) \quad \text{[Equation 3]}$$

That is, the signal $u_n$ before encoding corresponds to a remainder when dividing the encoded signal $v_n$ by m. By performing such encoding, an M-value symbol of $v_n \in \{0, 1, 2, \ldots, M-1\}$ is obtained as the encoded symbol $v_n$. The M value is a value determined by m and $\alpha$. For example, when m=4 and $\alpha=1/2$, M=6.

CITATION LIST

Non Patent Literature

Non Patent Literature 1: S. Yamamoto, et. al., 'O-band 10-km Transmission of 93-Gbaud PAM Signal Using Spectral Shaping Technique Based on Nonlinear Differential Coding with 1-Tap Precoding,' Proceeding of OFC2020, T3I.3 (2020)

SUMMARY OF INVENTION

Technical Problem

As described above, by performing encoding on a transmission side, it is possible to narrow the frequency band of the signal spectrum and to improve tolerance against band limitation and wavelength dispersion. On the other hand, a reception side performs determination on the M-value symbol and then decodes $u_n$ by modulo operation processing expressed in Equation (3). Thus, tolerance against white noise is equivalent to PAM-M. In general, as the multi-value number becomes larger, tolerance against white noise becomes lower. For example, in a case of m=4 and M=6, tolerance against band limitation and wavelength dispersion is improved by application of encoding. On the other hand, there is a problem that tolerance against white noise is reduced.

In view of the above circumstances, an object of the present invention is to provide a technique capable of preventing a decrease in tolerance against white noise due to encoding.

Solution to Problem

According to an aspect of the present invention, there is provided an optical signal demodulator including: an optical reception unit that receives an optical signal transmitted from a transmission unit via an optical fiber transmission line and converts the optical signal into an analog signal; an AD conversion unit that converts the analog signal converted by the optical reception unit into a digital signal; a digital signal processing unit that performs waveform shaping of the digital signal converted by the AD conversion unit; and a signal determination unit that performs bit determination of the digital signal on which waveform shaping is performed by the digital signal processing unit; in which the signal determination unit includes: a spectrum shaping filter processing unit that receives a reception signal sequence of the digital signal from the digital signal processing unit and outputs a value obtained by performing a convolution operation on the reception signal sequence which is received; a transmission line simulation filter processing unit that outputs a value obtained by performing a convolution operation on a candidate signal sequence which is determined based on a symbol transition of the reception signal; an error information acquisition unit that acquires error information between the value output from the spectrum shaping filter processing unit and the value output from the transmission line simulation filter processing unit; and a bit determination unit that determines a value of a bit included in the symbol transmitted by the transmission unit based on the error information acquired by the error information acquisition unit.

According to another aspect of the present invention, there is provided a control method of an optical signal demodulator including an optical reception unit that receives an optical signal transmitted from a transmission unit via an optical fiber transmission line and converts the optical signal into an analog signal, an AD conversion unit that converts the analog signal converted by the optical reception unit into a digital signal, a digital signal processing unit that performs waveform shaping of the digital signal converted by the AD conversion unit, and a signal determination unit that performs bit determination of the digital signal on which waveform shaping is performed by the digital signal processing unit, the method including: a spectrum shaping filter processing step of receiving a reception signal sequence of the digital signal from the digital signal processing unit and outputting a value obtained by performing a convolution operation on the reception signal sequence which is received; a transmission line simulation filter processing step of outputting a value obtained by performing a convolution operation on a candidate signal sequence which is determined based on a symbol transition of the reception signal; an error information acquisition step of acquiring error information between the value output from the spectrum shaping filter processing step and the value output from the transmission line simulation filter processing step; and a bit determination step of determining a value of a bit included in the symbol transmitted by the transmission unit based on the error information acquired by the error information acquisition step.

According to still another aspect of the present invention, there is provided a program causing a computer to execute the control method.

Advantageous Effects of Invention

According to the present invention, it is possible to prevent a decrease in tolerance against white noise due to encoding.

DESCRIPTION OF EMBODIMENTS

Hereinafter, embodiments of the present invention will be described in detail with reference to the drawings.

First Embodiment

Figure 1:
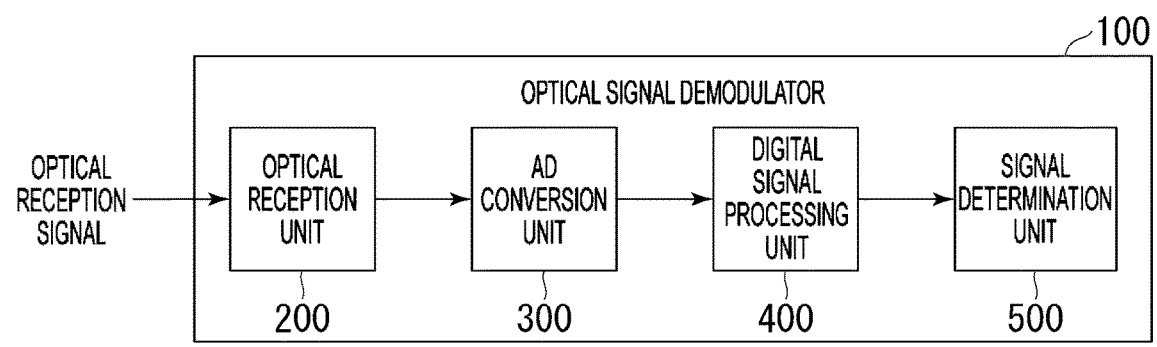
FIG. 1 is a block diagram illustrating a configuration of an optical signal demodulator.

FIG. 1 is a block diagram illustrating a configuration of an optical signal demodulator 100 according to a first embodiment. The optical signal demodulator 100 includes an optical reception unit (an optical receiver) 200, an analog-to-digital (AD) conversion unit (an AD converter) 300, a digital signal processing unit (a digital signal processor) 400, and a signal determination unit (a signal determinator) 500.

The optical reception unit 200 is a light intensity receiver in a case of a direct detection system, and is a coherent receiver in a case of a coherent detection system. The optical reception unit 200 converts an optical reception signal into an electrical analog signal, and outputs the electrical analog signal to the AD conversion unit 300. The AD conversion unit 300 converts the electrical analog signal into a digital signal, and outputs the digital signal to the digital signal processing unit 400. The digital signal processing unit 400 performs waveform shaping in the related art, and outputs a signal sequence obtained by the waveform shaping to the signal determination unit 500. The signal determination unit 500 performs bit determination based on a log likelihood ratio (LLR). In the following description, the log likelihood ratio may be referred to as LLR.

Figure 2:
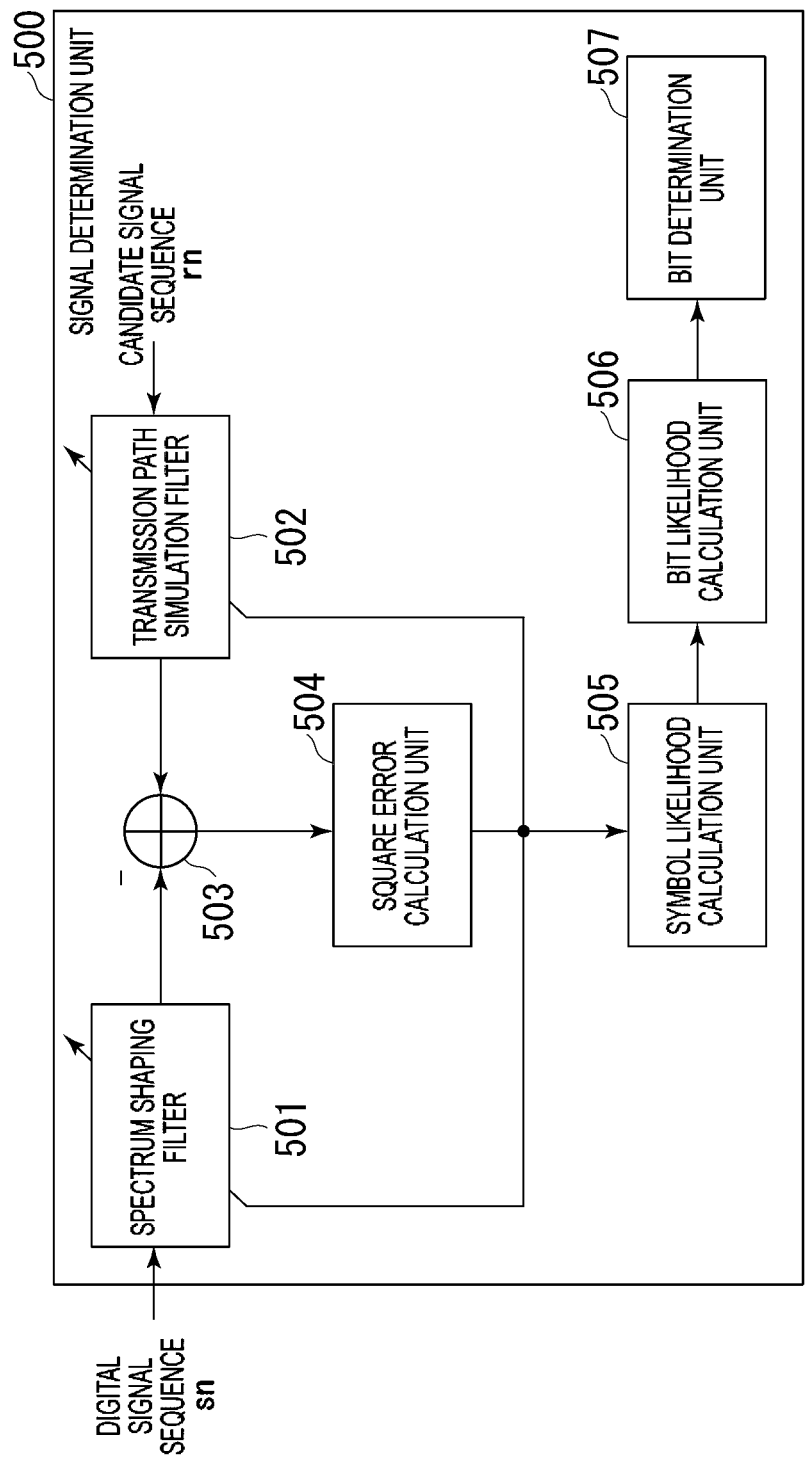
FIG. 2 is a block diagram illustrating a configuration of a signal determination unit.

FIG. 2 is a block diagram illustrating a configuration of the signal determination unit 500. The signal determination unit 500 includes a spectrum shaping filter processing unit (a spectrum shaping filter processor) 501, a transmission line simulation filter processing unit (a transmission line simulation filter processor) 502, a subtractor 503, a square error calculation unit 504, a symbol likelihood calculation unit (a symbol likelihood calculator) 505, a bit likelihood calculation unit (a bit likelihood calculator) 506, and a bit determination unit (a bit determinator) 507.

The spectrum shaping filter processing unit 501 and the transmission line simulation filter processing unit 502 perform processing using a finite impulse response (FIR) filter including T-interval taps. Further, the spectrum shaping filter processing unit 501 and the transmission line simulation filter processing unit 502 respectively operate in a filter form such that an output from the square error calculation unit 504 is minimized.

A digital signal sequence $s_n$ in units of sample per symbol (Sps) that is waveform-shaped by the digital signal processing unit 400 is input to the spectrum shaping filter processing unit 501. The spectrum shaping filter processing unit 501 performs a convolution operation on $s_n$, and outputs a result of the convolution operation to the subtractor 503.

A candidate signal sequence $r_n$ assumed as a transmission signal is stored. The transmission line simulation filter processing unit 502 receives the candidate signal sequence $r_n$ assumed as a transmission signal. The transmission line simulation filter processing unit 502 performs a convolution operation on $r_n$, and outputs a result of the convolution operation to the subtractor 503.

The subtractor 503 subtracts a value output from the spectrum shaping filter processing unit 501 from a value output from the transmission line simulation filter processing unit 502, and outputs a subtracted value to the square error calculation unit 504. The square error calculation unit 504 is an example of an error information acquisition unit (an error information acquisitor). The square error calculation unit 504 acquires error information on each candidate signal sequence by using an output from the subtractor 503. In the present embodiment, a square error is used as an example of the error information. The square error calculation unit 504 outputs the acquired square error to the symbol likelihood calculation unit 505. The square error is also expressed as a branch metric.

The symbol likelihood calculation unit 505 calculates a likelihood of each symbol $u_n$ before encoding based on each branch metric, and outputs the likelihood to the bit likelihood calculation unit 506. The bit likelihood calculation unit 506 calculates an LLR of each bit included in the symbol $u_n$ before encoding, and outputs the LLR to the bit determination unit 507. The bit determination unit 507 performs bit determination based on the LLR of each bit, and restores a transmission bit sequence.

The above-described configuration will be described using a specific example. First, it is assumed that the transmission signal is a signal obtained by performing encoding expressed by Equation (1) and Equation (2) and that $\alpha=1/2$ and m=4. At this time, it is assumed that M=6. For a four-value symbol before encoding, it is assumed that bits 00 are assigned to a symbol 0, that bits 01 are assigned to a symbol 1, that bits 11 are assigned to a symbol 2, and that bits 10 are assigned to a symbol 3.

At this time, a symbol transition of an encoded symbol $v_n$ will be described. FIG. 3A to FIG. 3F are diagrams illustrating symbol transitions of $v_n$. FIG. 3A to FIG. 3F illustrate symbols for which a transition can be performed in a case where $v_{n-1}$ has each value from 0 to 5. In FIG. 3A to FIG. 3F, $u_n$ is referred to as u_n.

Figure 3A:
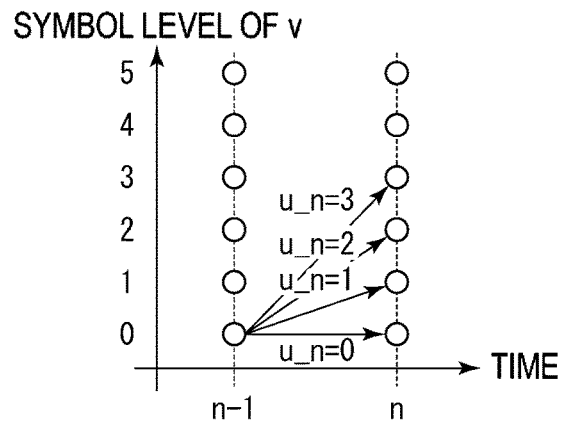
FIG. 3A is a diagram illustrating a symbol transition of $v_n$.
Figure 3B:
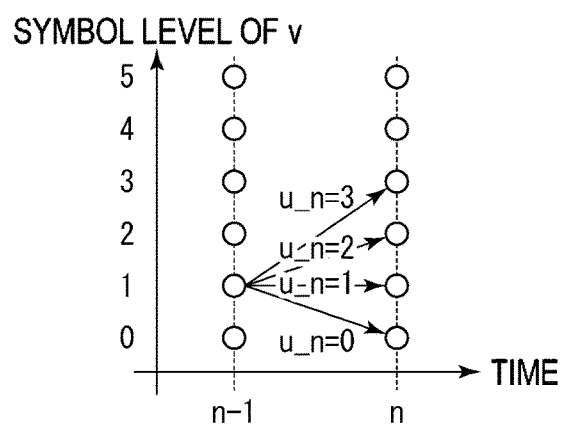
FIG. 3B is a diagram illustrating a symbol transition of $v_n$.
Figure 3C:
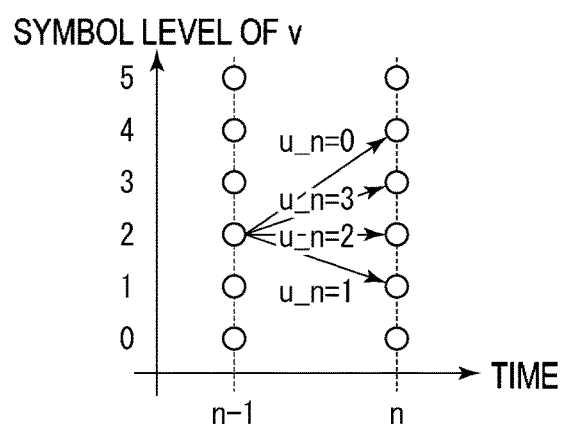
FIG. 3C is a diagram illustrating a symbol transition of $v_n$.
Figure 3D:
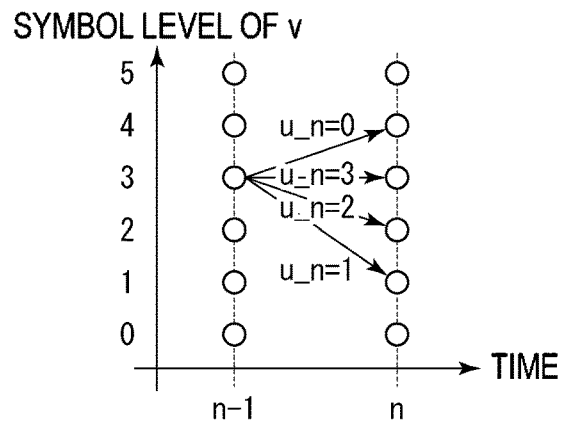
FIG. 3D is a diagram illustrating a symbol transition of $v_n$.
Figure 3E:
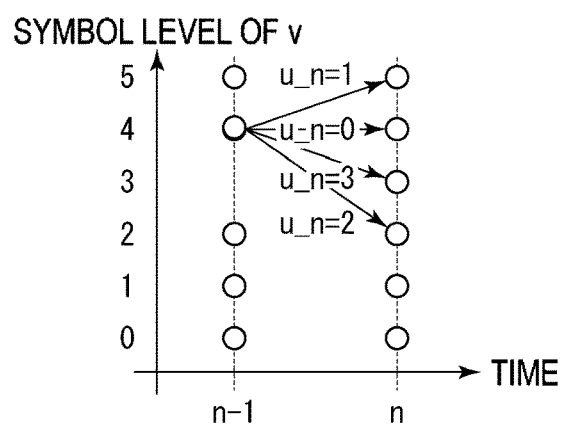
FIG. 3E is a diagram illustrating a symbol transition of $v_n$.
Figure 3F:
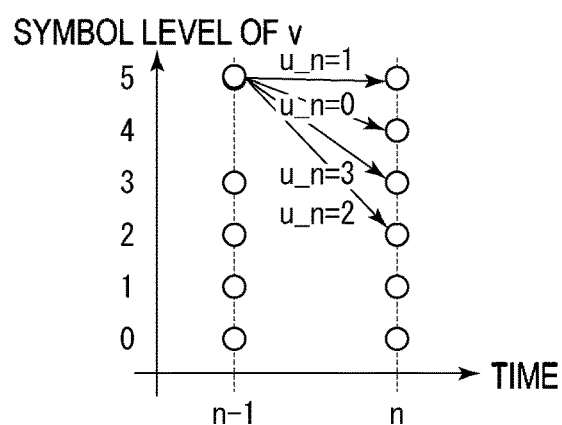
FIG. 3F is a diagram illustrating a symbol transition of $v_n$.

FIG. 3A is a diagram illustrating a symbol transition of $v_n$ in a case of $v_{n-1}=0$. FIG. 3B is a diagram illustrating a symbol transition of $v_n$ in a case of $v_{n-1}=1$. FIG. 3C is a diagram illustrating a symbol transition of $v_n$ in a case of $v_{n-1}=2$. FIG. 3D is a diagram illustrating a symbol transition of $v_n$ in a case of $v_{n-1}=3$. FIG. 3E is a diagram illustrating a symbol transition of $v_n$ in a case of $v_{n-1}=4$. FIG. 3F is a diagram illustrating a symbol transition of $v_n$ in a case of $v_{n-1}=5$.

As illustrated in FIG. 3A to FIG. 3F, it can be seen that there is a correspondence relationship between the symbol transition of $v_n$ and the symbol $u_n$ before encoding. Therefore, it is possible to restore the symbol $u_n$ before encoding from the symbol transition of $v_n$ without performing determination on the encoded symbol $v_n$.

From FIG. 3A to FIG. 3F, in a case where certain timings n−1 and n are focused, the following 24 transmission symbol candidates $(r_{n-1}, r_n)$ in the digital signal sequence corresponding to the above-described assumed candidate signal sequence are obtained.

(0, 0), (0, 1), (0, 2), (0, 3), (1, 0), (1, 1), (1, 2), (1, 3), (2, 1), (2, 2), (2, 3), (2, 4), (3, 1), (3, 2), (3, 3), (3, 4), (4, 2), (4, 3), (4, 4), (4, 5), (5, 2), (5, 3), (5, 4), (5, 5)

As described above, the candidate signal sequence indicates an encoded symbol sequence, and a transition between the encoded symbol sequences is limited by the symbols before encoding. In addition, the symbol is uniquely determined corresponding to the candidate signal sequence. For example, in a case where the encoded symbol sequences $v_{n-1}$ and $v_n$ are both 0, the symbol $u_n$ before encoding is uniquely determined to be 0.

It is assumed that the number of taps of each of the spectrum shaping filter processing unit 501 and the transmission line simulation filter processing unit 502 is 2. At this time, the following is obtained as an output of the square error calculation unit 504.

[Equation 4]

$$l_{r_{n-1}r_n} = \left|(d_0 r_n + d_1 r_{n-1}) - \sum_{i=0}^{k-1} C_i S_{n-i}\right|^2 + m_{r_{n-1}} \quad (4)$$

Here, assuming that k=2, the following is obtained.

[Equation 5]

$$\tilde{m}_{r_{n-1}} = \min_{r_{n-2}} l_{r_{n-2}r_{n-1}} \quad (5)$$

[Equation 6]

$$m_{r_{n-1}} = \tilde{m}_{r_{n-1}} = \min_{r_{n-1}} \tilde{m}_{r_{n-1}} \quad (6)$$

[Equation 7]

$$m_{r_0} = 0 \quad (7)$$

The square error calculation unit 504 calculates a square error $l_{r_{n-1}r_n}$ of all possible candidates $(r_{n-1}, r_n)$. Note that $mr_n$ is a factor representing an influence from the previous symbol sequence. In a case where the influence from the previous symbol sequence is ignored, for all n in Equation (4), $mr_{n-1}=0$ may be set. In this case, it is possible to omit processing of calculating Equation (5) and Equation (6), which are arithmetic processing for calculating the influence from the previous symbol sequence. Therefore, in a case where calculation load reduction is prioritized, $mr_{n-1}=0$ may be set. The square error calculation unit 504 outputs the calculated $lr_{n-1}r_n$ to the symbol likelihood calculation unit 505.

The symbol likelihood calculation unit 505 calculates $L_u$ by the following Equation (8).

[Equation 8]

$$L_u = \sum_{(p,q) \in U_u} \exp\left[-\frac{l_{pq}}{2\sigma^2}\right] \quad (8)$$

Here, u corresponds to the symbol un before encoding, and for example, $L_3$ represents a likelihood for $u_n=3$. In addition, $\sigma$ is a parameter corresponding to a signal-to-noise ratio (SNR) of the reception signal. In implementation, $\sigma$ that minimizes a bit error rate (BER) may be used. In Equation (8), $\Sigma$ means summing up all symbol transitions corresponding to the symbol u before encoding. Pairs of p and q corresponding to each $U_n$ are as follows.

$U_0$={(0,0), (1,0), (2,4), (3,4), (4,4), (5,4)}

$U_1$={(0,1), (1,1), (2,1), (3,1), (4,5), (5,5)}

$U_2$={(0,2), (1,2), (2,2), (3,2), (4,2), (5,2)}

$U_3$={(0,3), (1,3), (2,3), (3,3), (4,3), (5,3)}

The symbol likelihood calculation unit 505 outputs the calculated $L_u$ to the bit likelihood calculation unit 506. Here, a leftmost bit is referred to as a most significant bit (MSB), and a rightmost bit is referred to as a least significant bit (LSB). The bit likelihood calculation unit 506 calculates $LLR_{MSB}$ as a bit likelihood by the following Equation (9), and calculates $LLR_{LSB}$ by the following Equation (10). Here, $LLR_{MSB}$ indicates LLR of MSB, and $LLR_{LSB}$ indicates LLR of LSB.

[Equation 9]

$$LLR_{MSB} = \ln \frac{L_0 + L_1}{L_2 + L_3} \quad (9)$$

[Equation 10]

$$LLR_{LSB} = \ln \frac{L_0 + L_3}{L_1 + L_2} \quad (10)$$

In Equation (9), in an antilogarithm on the right side, $u_n$ corresponding to $L_2$ and $L_3$ of a denominator both have MSB of 1. Thus, the denominator indicates a probability that MSB is 1. On the other hand, $u_n$ corresponding to $L_0$ and $L_1$ of a numerator both have MSB of 0. Thus, the numerator indicates a probability that MSB is 0. In a case where the antilogarithm on the right side is larger than 1, $LLR_{MSB}$ is positive, and in a case where the antilogarithm is smaller than 1, $LLR_{MSB}$ is negative.

Similarly, in Equation (10), in an antilogarithm on the right side, $u_n$ corresponding to $L_1$ and $L_2$ of a denominator both have LSB of 1. Thus, the denominator indicates a probability that LSB is 1. On the other hand, $u_n$ corresponding to $L_0$ and $L_3$ of a numerator both have LSB of 0. Thus, the numerator indicates a probability that LSB is 0. In a case where the antilogarithm on the right side is larger than 1, $LLR_{LSB}$ is positive, and in a case where the antilogarithm is smaller than 1, $LLR_{LSB}$ is negative.

The bit likelihood calculation unit 506 outputs the calculated $LLR_{MSB}$ and the calculated $LLR_{LSB}$ to the bit determination unit 507. The bit determination unit 507 obtains $x_{MSB}$ and $x_{LSB}$ as a result of bit determination by using the following Equation (11) and Equation (12). Here, $x_{MSB}$ indicates a determination result of MSB. $x_{LSB}$ indicates a bit determination result of LSB.

[Equation 11]

$$x_{MSB} = \begin{cases} 0, & LLR_{MSB} \geq 0 \\ 1, & LLR_{MSB} < 0 \end{cases} \quad (11)$$

[Equation 12]

$$x_{LSB} = \begin{cases} 0, & LLR_{LSB} \geq 0 \\ 1, & LLR_{LSB} < 0 \end{cases} \quad (12)$$

Figure 4:
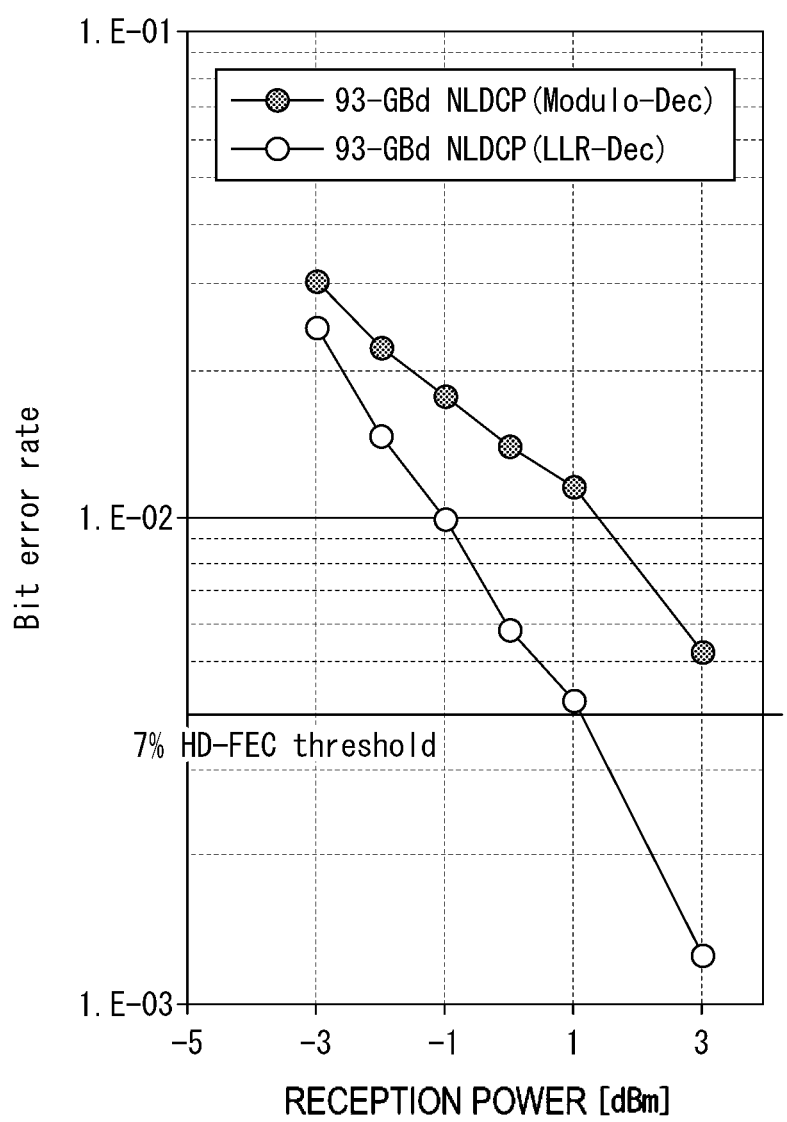
FIG. 4 is a diagram illustrating an evaluation result of transmission performance.

The bit determination unit 507 determines a left bit as $x_{MSB}$, and determines a right bit as $x_{LSB}$. FIG. 4 is a diagram illustrating an evaluation result of transmission performance. In the graph illustrated in FIG. 4, a horizontal axis indicates reception power (dBm), and a vertical axis indicates a bit error rate. The bit error rate illustrated in FIG. 4 is measured at a modulation rate of 93 Gbuad, a transmission capacity of 186 Gb/s, and a transmission distance of 10 km. Further, a threshold value related to hard-determination forward error correction with 7% overhead is illustrated.

Further, the graph illustrated by "93-GBd NLDCP (LLR-Dec)" indicates a bit error rate in a case where the present embodiment is applied. On the other hand, the graph illustrated by "93-GBd NLDCP (Modulo-Dec)" indicates a bit error rate in a case where the present embodiment is not applied. As illustrated in FIG. 4, according to the present embodiment, it can be confirmed that sensitivity degradation due to six-value symbol determination is prevented and the bit error rate is reduced.

Figure 5:
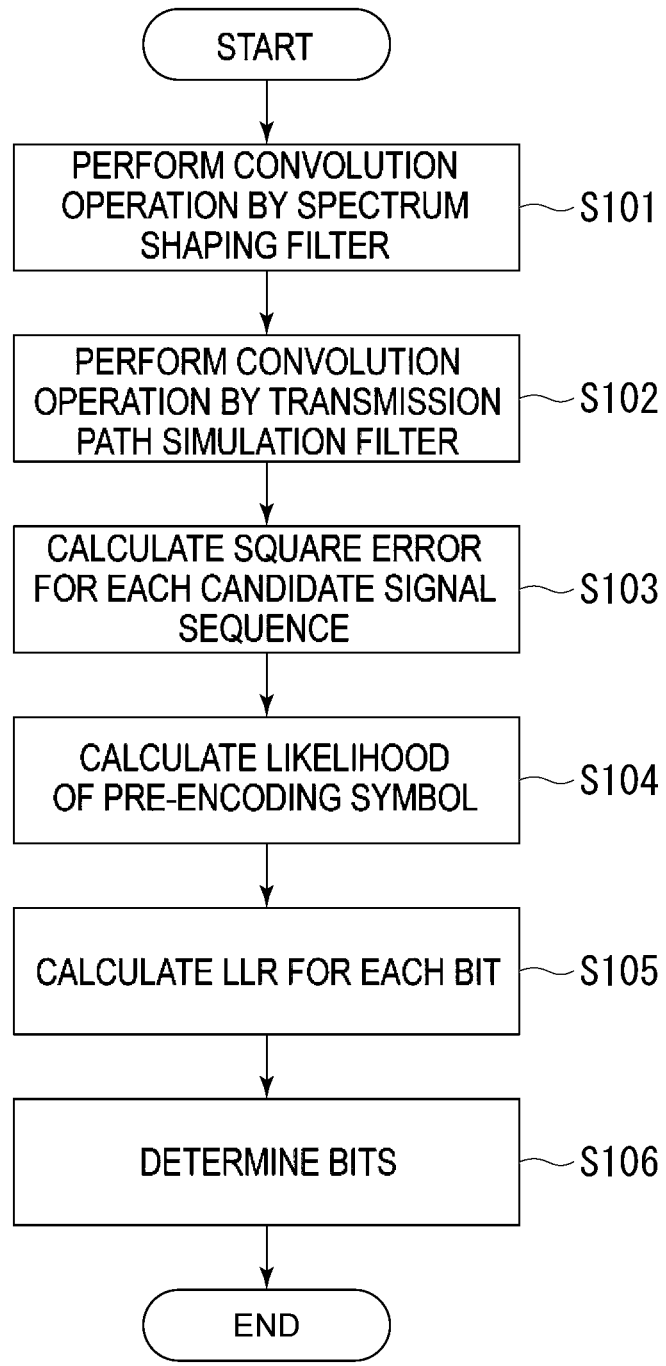
FIG. 5 is a flowchart illustrating a flow of processing of the signal determination unit.

FIG. 5 is a flowchart illustrating a flow of processing of the signal determination unit 500 according to the first embodiment. The spectrum shaping filter processing unit 501 performs a convolution operation on $s_n$ by the spectrum shaping filter expressed by Equation (4) (step S101). The transmission line simulation filter processing unit 502 performs a convolution operation on the digital signal sequence $r_n$ corresponding to the candidate signal sequence expressed by Equation (4) (step S102).

The square error calculation unit 504 calculates a square error of each candidate signal sequence based on the output from the subtractor 503 by using Equation (4) (step S103). The symbol likelihood calculation unit 505 calculates a likelihood $L_3$ of each symbol $u_n$ before encoding based on each branch metric by using Equation (8) (step S104). The bit likelihood calculation unit 506 calculates an LLR of each bit included in the symbol $u_n$ before encoding by using Equation (9) and Equation (10) (step S105). The bit determination unit 507 determines the bit from the LLR of each bit according to Equation (11) and Equation (12) (step S106), and the processing is ended.

Second Embodiment

The optical signal demodulator 100 illustrated in FIG. 1 can prevent a decrease in tolerance against white noise due to encoding even in a case where a transmission signal is not necessarily a signal to which encoding is applied in a transmitter. In a case where the signal is not a signal to which encoding is applied, band limitation and wavelength dispersion of the transmission line play a role corresponding to an encoder. In a second embodiment, an optical signal demodulator in a case where a transmission signal is a PAM4 signal to which any encoding is not particularly applied will be described using the first embodiment.

FIG. 6A to FIG. 6D are diagrams illustrating symbol transitions of $v_n$. FIG. 6A to FIG. 6D illustrate symbols for which a transition can be performed in a case where $u_{n-1}$ has each value from 0 to 3. In FIG. 6A to FIG. 6D, $u_n$ is referred to as u_n.

Figure 6A:
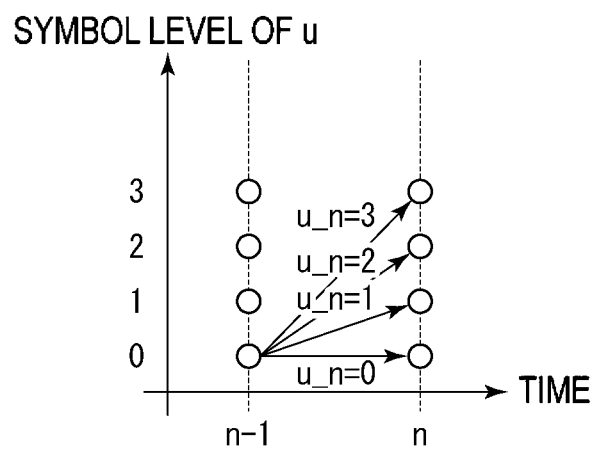
FIG. 6A is a diagram illustrating a symbol transition of a PAM4 symbol $u_n$.
Figure 6B:
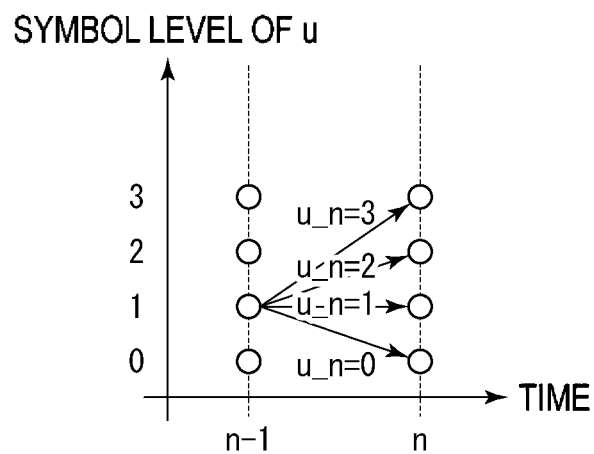
FIG. 6B is a diagram illustrating a symbol transition of a PAM4 symbol $u_n$.
Figure 6C:
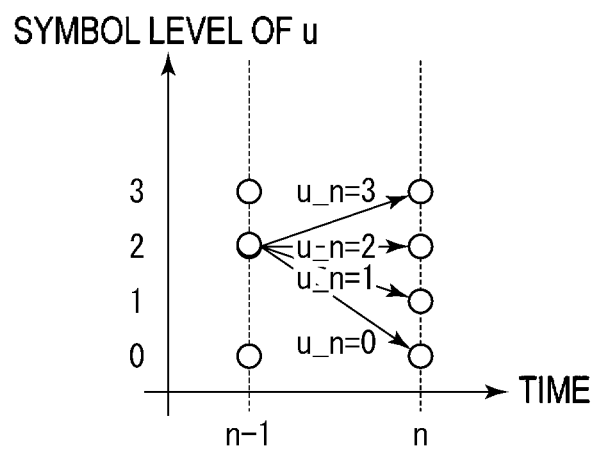
FIG. 6C is a diagram illustrating a symbol transition of a PAM4 symbol $u_n$.
Figure 6D:
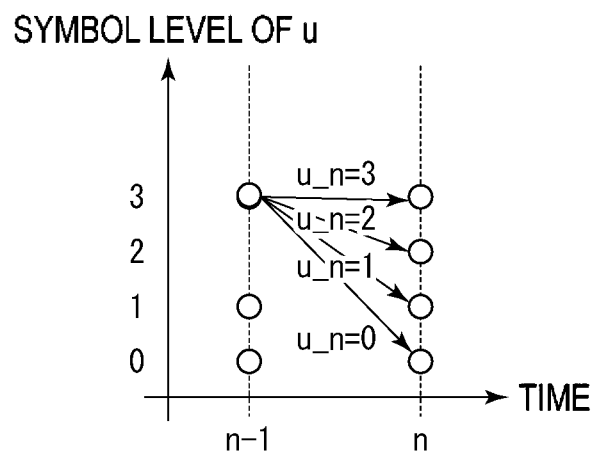
FIG. 6D is a diagram illustrating a symbol transition of a PAM4 symbol $u_n$.

FIG. 6A is a diagram illustrating a symbol transition of $u_n$ in a case of $u_{n-1}=0$. FIG. 6B is a diagram illustrating a symbol transition of $u_n$ in a case of $u_{n-1}=1$. FIG. 6C is a diagram illustrating a symbol transition of $u_n$ in a case of $u_{n-1}=2$. FIG. 6D is a diagram illustrating a symbol transition of $u_n$ in a case of $u_{n-1}=3$.

As illustrated in FIG. 6A to FIG. 6D, it can be seen that there is a correspondence relationship between the symbol transition of $u_n$ and the symbol $u_n$ itself. Therefore, it is possible to restore $u_n$ from the symbol transition of $u_n$ without directly performing determination on the symbol $u_n$.

From FIG. 6A to FIG. 6D, in a case where certain timings n−1 and n are focused, 16 assumed transmission symbol candidates ($r_{n-1}$, $r_n$) are obtained as follows.

(0, 0), (0, 1), (0, 2), (0, 3), (1, 0), (1, 1), (1, 2), (1, 3), (2, 0), (2, 1), (2, 2), (2, 3), (3, 0), (3, 1), (3, 2), (3, 3)

It is assumed that the number of taps of each of the spectrum shaping filter processing unit 501 and the transmission line simulation filter processing unit 502 is 2 as in the first embodiment. The output of the square error calculation unit 504 is as described in Equation (4) to Equation (7). The square error calculation unit 504 calculates a square error $lr_{n-1}r_n$ of all possible candidates ($r_{n-1}$, $r_n$). The square error calculation unit 504 outputs the calculated $lr_{n-1}r_n$ to the symbol likelihood calculation unit 505.

The symbol likelihood calculation unit 505 calculates $L_u$ by following Equation (13).

[Equation 13]
$$L_u = \sum_{p=0}^{3} \exp\left[-\frac{l_{pu}}{2\sigma^2}\right] \quad (13)$$

Here, u corresponds to the symbol $u_n$ before encoding, and for example, $L_3$ represents a likelihood for $u_n=3$. As in the first embodiment, $\sigma$ is a parameter corresponding to a signal-to-noise ratio of the reception signal. In implementation, $\sigma$ that minimizes a bit error rate may be used.

The symbol likelihood calculation unit 505 outputs the calculated $L_u$ to the bit likelihood calculation unit 506. The bit likelihood calculation unit 506 calculates $LLR_{MSB}$ and $LLR_{LSB}$ by Equation (9) and Equation (10) as in the first embodiment.

The bit likelihood calculation unit 506 outputs the $LLR_{MSB}$ and the $LLR_{LSB}$, which are calculated as the bit likelihood, to the bit determination unit 507. The bit determination unit 507 obtains $x_{MSB}$ and $x_{LSB}$ as a result of bit determination by using Equation (11) and Equation (12) described above.

As described above, the optical signal demodulator 100 can be applied to any transmission signal as long as the transmission signal is a signal in which the symbol transition of the reception signal and the transmission signal are associated as illustrated in FIG. 3 and FIG. 6. Therefore, not only an intensity modulation signal such as PAM4 but also a signal obtained by modulating a complex electric field, such as a QPSK signal or a quadrature amplitude modulation (QAM) signal, can be applied. In this case, the spectrum shaping filter processing, the transmission line simulation filter processing, the square error calculation processing, the likelihood calculation processing, the bit LLR calculation processing, and the bit determination processing are performed on each of in-phase components and quadrature components of the QAM signal by the configuration illustrated in FIG. 2.

Third Embodiment

In a third embodiment, the signal determination unit 500 in which an amount of computations is reduced as compared with the first embodiment and the second embodiment will be described by using the first embodiment and the second embodiment. It is assumed that a transmission signal handled in the third embodiment is a PAM4 signal as in the second embodiment.

In the third embodiment, an equation for calculating $L_u$ by the symbol likelihood calculation unit 505 is set to the following Equation (14) instead of Equation (13).

[Equation 14]
$$L_u = \min_{p \in \{0,1,2,3\}} l_{pu} \quad (14)$$

As expressed in Equation (14), a minimum value among $l_{0u}$, $l_{1u}$, $l_{2u}$, and $l_{3u}$ is set to $L_u$ instead of an exponential operation exp. As described above, the minimum value of the square error indicated by the error information acquired by the square error calculation unit 504 is calculated as a symbol likelihood. The symbol likelihood calculation unit 505 outputs the calculated $L_u$ to the bit likelihood calculation unit 506. The bit likelihood calculation unit 506 calculates $LLR_{MSB}$ and $LLR_{LSB}$ as a bit likelihood according to the following Equations (15) and (16).

[Equation 15]
$$LLR_{MSB} = \min_{u \in \{2,3\}} L_u - \min_{u \in \{0,1\}} L_u \quad (15)$$

[Equation 16]
$$LLR_{LSB} = \min_{u \in \{1,2\}} L_u - \min_{u \in \{0,3\}} L_u \quad (16)$$

The bit likelihood calculation unit 506 outputs the calculated $LLR_{MSB}$ and the calculated $LLR_{LSB}$ to the bit determination unit 507. In Equation (15), min {$L_2$, $L_3$} is a symbol likelihood that minimizes the symbol likelihood in a case where MSB is 0. Further, in Equation (15), min {$L_0$, $L_1$} is a symbol likelihood that minimizes the symbol likelihood in a case where MSB is 1.

Similarly, in Equation (16), min {$L_1$, $L_2$} is a symbol likelihood that minimizes the symbol likelihood in a case where LSB is 0. Further, in Equation (16), min {$L_0$, $L_3$} is a symbol likelihood that minimizes the symbol likelihood in a case where LSB is 1. As described above, as the bit likelihood for each bit included in the symbol, a difference between the symbol likelihood that minimizes the symbol likelihood in a case where the bit is 0 and the symbol likelihood that minimizes the symbol likelihood in a case where the bit is 1 is calculated.

The bit determination unit 507 obtains $x_{MSB}$ and $x_{LSB}$ as a result of bit determination by using Equation (11) and Equation (12) described above.

As described above, in the third embodiment, an exponential operation exp is not performed. Therefore, as compared with the first embodiment and the second embodiment, the third embodiment has a feature that an amount of computations can be reduced by executing bit determination without performing an exponential operation exp. Further, the third embodiment has a feature that bit determination can be performed without using the parameter σ in a series of processing by the signal determination unit 500. This means that selection of the parameter σ is not necessary by applying the present embodiment and that computation processing for selecting a value of σ can be omitted.

Fourth Embodiment

Figure 7:
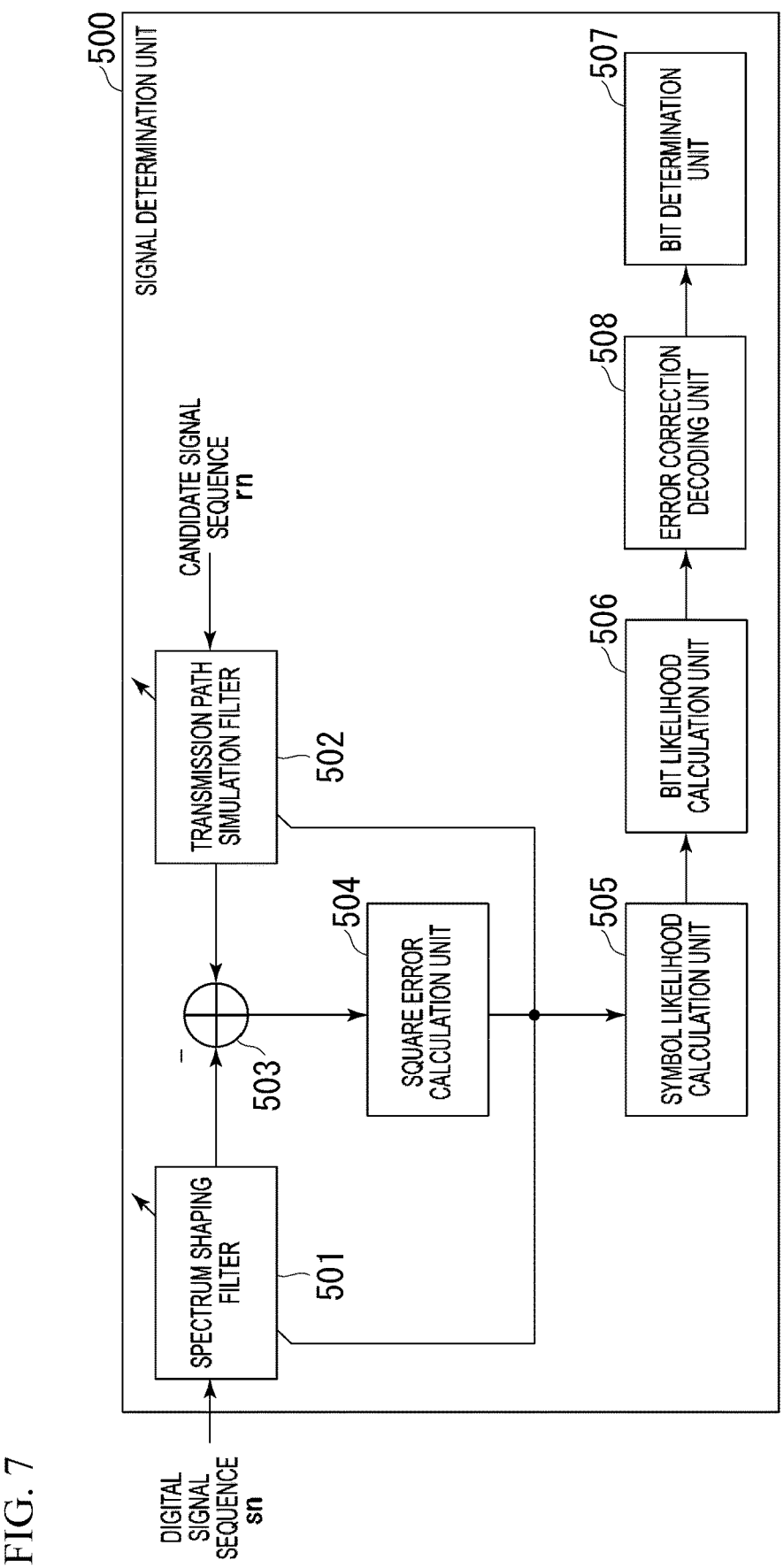
FIG. 7 is a block diagram illustrating a configuration of the signal determination unit 500.

In a fourth embodiment, a configuration example for a transmission signal to which a soft-determination error correction code is applied will be described. FIG. 7 is a block diagram illustrating a configuration of the signal determination unit 500 according to the fourth embodiment. As illustrated in FIG. 7, the signal determination unit 500 according to the fourth embodiment includes an error correction decoding unit 508 between the bit determination unit 507 and the bit likelihood calculation unit 506, in addition to the configuration described with reference to FIG. 2.

The bit likelihood calculation unit 506 calculates a bit likelihood by the Equation described in the first, second, and third embodiments, and outputs the calculated bit likelihood to the error correction decoding unit 508. The error correction decoding unit 508 corrects a bit error by executing error correction decoding using the bit likelihood, and outputs a bit sequence after error correction to the bit determination unit 507. The bit determination unit 507 obtains a determination bit sequence by performing bit determination on the bit sequence after error correction. As described above, according to the fourth embodiment, error correction decoding can be performed by using the bit likelihood obtained by the bit likelihood calculation unit 506.

There is no limitation on the soft-determination error correction code. Examples of the soft-determination error correction code include a turbo code and a low density parity check (LDPC) code.

The signal determination unit 500 includes a processor such as a central processing unit (CPU) and a memory. In a case where the processor executes the program, the signal determination unit 500 functions as the spectrum shaping filter processing unit 501, the transmission line simulation filter processing unit 502, the subtractor 503, the square error calculation unit 504, the symbol likelihood calculation unit 505, the bit likelihood calculation unit 506, and the bit determination unit 507. All or some of the functions of the signal determination unit 500 may be realized by using hardware such as an application specific integrated circuit (ASIC), a programmable logic device (PLD), or a field programmable gate array (FPGA). The program may be recorded in a computer-readable recording medium. The computer-readable recording medium is, for example, a portable medium such as a flexible disk, a magneto-optical disk, a ROM, a CD-ROM, or a semiconductor storage device (for example, a solid state drive (SSD)), or a storage device such as a hard disk or a semiconductor storage device built in a computer system. The program may be transmitted via an electric communication line.

The optical signal demodulator 100 configured as described above calculates the square error from the digital signal sequence $s_n$ and the candidate signal sequence $r_n$, calculates the likelihood, decodes $u_n$ without performing determination on the M(>m)-value symbol, and performs determination on the bit included in $u_n$. Thereby, it is possible to prevent a decrease in tolerance against white noise due to encoding.

As above, the embodiments of the present invention have been described in detail with reference to the drawings. On the other hand, the specific configuration is not limited to the embodiments, and includes design and the like without departing from the spirit of the present invention.

INDUSTRIAL APPLICABILITY

The present invention can be applied to an optical signal demodulator that demodulates an optical signal transmitted from a transmission unit via an optical fiber transmission line.

REFERENCE SIGNS LIST 100 optical signal demodulator
200 optical reception unit
300 AD conversion unit
400 digital signal processing unit
500 signal determination unit
501 spectrum shaping filter processing unit
502 transmission line simulation filter processing unit
503 subtractor
504 square error calculation unit
505 symbol likelihood calculation unit
506 bit likelihood calculation unit
507 bit determination unit

The invention claimed is:

1. An optical signal demodulator comprising:
an optical receiver configured to receive an optical signal transmitted from a transmitter via an optical fiber transmission line and convert the optical signal into an analog signal;
an analog to digital (AD) converter configured to convert the analog signal which has been converted by the optical receiver into a digital signal;
a digital signal processor configured to perform waveform shaping of the digital signal which has been converted by the AD converter; and
a signal determinator configured to perform bit determination of the digital signal on which waveform shaping has been performed by the digital signal processor;
wherein the signal determinator comprises:
a spectrum shaping filter processor configured to receive a reception signal sequence of the digital signal from the digital signal processor and output a value obtained by performing a convolution operation on the reception signal sequence which has been received in case that the transmitter transmits an encoded m-value symbol $v_n$ generated based on the following Equations (1) and (2) in case that
n is a parameter representing a timing,
$u_n \in \{0, 1, 2, \ldots, m-1\}$ is an m-value symbol before encoding, and
α is any real number satisfying 0<α<1;
a transmission line simulation filter processor configured to output a value obtained by performing a convolution operation on a candidate signal sequence which has been determined based on a symbol transition of the reception signal;

an error information acquisitor configured to acquire error information between the value output from the spectrum shaping filter processor and the value output from the transmission line simulation filter processor;

a symbol likelihood calculator configured to calculate a symbol likelihood indicating a likelihood of the symbol before encoding, the calculation of the symbol likelihood being performed based on the error information acquired by the error information acquisitor; and a bit determinator configured to determine a value of a bit included in the symbol before encoding based on the symbol likelihood calculated by the symbol likelihood calculator, wherein the candidate signal sequence is a sequence ($r_{n-1}$, $r_n$) indicating a transition of the encoded symbol, wherein the symbol before encoding is uniquely determined corresponding to the candidate signal sequence, wherein the error information acquisitor is configured to calculate a value to which a factor $mr_{n-1}$ is added representing an influence from a previous symbol sequence represented by the following Equations (5) to (7) for a square error of the value output from the spectrum shaping filter processor and the value output from the transmission line simulation filter processor in case that the error information is $lr_{n-1}r_n$ in case that in case that certain timings n−1 and n are focused, wherein the symbol likelihood calculator is configured to calculate a likelihood of each symbol before encoding by a sum of likelihoods calculated from the error information acquired by the error information acquisitor, the error information being acquired from a value obtained by performing a convolution operation on the candidate signal sequence including same symbol before encoding and the value output from the spectrum shaping filter processor, and wherein the Equations (1), (2), (5), (6) and (7) are as follows:

$$v_n = \tilde{u}_n + \lfloor \alpha v_{n-1} \rfloor \quad (1)$$

$$\tilde{u}_n = \mathrm{mod}(u_n - \lfloor \alpha v_{n-1} \rfloor, m) \quad (2)$$

$$\tilde{m}_{r_{n-1}} = \min_{r_{n-2}} l_{r_{n-2} r_{n-1}} \quad (5)$$

$$m_{r_{n-1}} = \tilde{m}_{r_{n-1}} - \min_{r_{n-1}} \tilde{m}_{r_{n-1}} \quad (6)$$

$$m_{r_0} = 0 \quad (7).$$

2. The optical signal demodulator according to claim 1, wherein, in case that a multi-value number of the symbol before encoding is 4, and in case that a multi-value number of the symbol after encoding is 6, the symbol likelihood calculator is configured to calculate a likelihood of each symbol before encoding based on following Equations of $U_u$ in case that a group of the candidate signal sequence ($r_{n-1}$, $r_n$) including same symbol $u_n$ before encoding is the $U_u$, and the Equations of $U_u$ are as follows:

$U_0 = \{(0,0), (1,0), (2,4), (3,4), (4,4), (5,4)\}$ $U_1 = \{(0,1), (1,1), (2,1), (3,1), (4,5), (5,5)\}$ $U_2 = \{(0,2), (1,2), (2,2), (3,2), (4,2), (5,2)\}$ $U_3 = \{(0,3), (1,3), (2,3), (3,3), (4,3), (5,3)\}$.

3. The optical signal demodulator according to claim 1, wherein:

the signal determinator further includes a bit likelihood calculator configured to calculate a bit likelihood indicating a likelihood of a value of a bit included in the symbol before encoding from the symbol likelihood calculated by the symbol likelihood calculator, and the bit likelihood calculator is configured to calculate a log likelihood ratio of a value of a bit for each bit included in the symbol before encoding.

4. The optical signal demodulator according to claim 3, wherein a soft-determination error correction code is applied to the optical signal transmitted by the transmitter, and the signal determinator further includes an error correction decoder configured to perform error correction decoding using the bit likelihood that has been calculated by the bit likelihood calculator.

5. A control method of an optical signal demodulator, the control method comprising receiving an optical signal transmitted from a transmitter via an optical fiber transmission line and converting the optical signal into an analog signal;

converting the analog signal which has been converted into a digital signal;

performing waveform shaping of the digital signal which has been converted;

performing bit determination of the digital signal on which waveform shaping has been performed;

receiving a reception signal sequence of the digital signal from the digital signal processor and outputting a value obtained by performing a convolution operation on the reception signal sequence which has been received in case that the transmitter transmits an encoded m-value symbol $v_n$ generated based on the following Equations (1) and (2) in case that n is a parameter representing a timing, $u_n \in \{0, 1, 2, \ldots, m-1\}$ is an m-value symbol before encoding, and $\alpha$ is any real number satisfying $0 < \alpha < 1$;

outputting a value obtained by performing a convolution operation on a candidate signal sequence which has been determined based on a symbol transition of the reception signal;

acquiring error information between the value output from the step of receiving a reception signal and the value output from the step of outputting a value;

calculating a symbol likelihood indicating a likelihood of the symbol before encoding, the calculation of the symbol likelihood being performed based on the error information acquired; and determining a value of a bit included in the symbol before encoding based on the symbol likelihood calculated, wherein the candidate signal sequence is a sequence ($r_{n-1}$, $r_n$) indicating a transition of the encoded symbol, wherein the symbol before encoding is uniquely determined corresponding to the candidate signal sequence, wherein a value to which a factor $mr_{n-1}$ is added representing an influence from a previous symbol sequence represented by the following Equations (5) to (7) is calculated for a square error of the value obtained by performing the convolution operation on the reception signal sequence and the value obtained by performing a convolution operation on a candidate signal sequence in case that the error information is lrn−lrn in case that in case that certain timings n−1 and n are focused, wherein a likelihood of each symbol before encoding is calculated by a sum of likelihoods calculated from the error information acquired, the error information being acquired from a value obtained by performing a convolution operation on the candidate signal sequence including same symbol before encoding and the value obtained by performing a convolution operation on the reception signal sequence, and wherein the equations (1), (2), (5), (6) and (7) are as follows:

$$v_n = \tilde{u}_n + \lfloor \alpha v_{n-1} \rfloor \tag{1}$$

$$\tilde{u}_n = \mathrm{mod}(u_n - \lfloor \alpha v_{n-1} \rfloor, m) \tag{2}$$

$$\tilde{m}_{r_{n-1}} = \min_{r_{n-2}} l_{r_{n-2} r_{n-1}} \tag{5}$$

$$m_{r-1} = \tilde{m}_{r_{n-1}} - \min_{r_{n-1}} \tilde{m}_{r_{n-1}} \tag{6}$$

$$m_{r_0} = 0 \tag{7}.$$

6. A non transitory computer readable recording media which stores a program causing a computer to execute the control method according to claim 5.

\* \* \* \* \*